United States Patent
Qian

(10) Patent No.: US 10,217,960 B2
(45) Date of Patent: Feb. 26, 2019

(54) OLED ENCAPSULATION METHOD

(71) Applicant: Shenzhen China Star Optoelectronics Technology Co., Ltd., Shenzhen (CN)

(72) Inventor: Jiajia Qian, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/509,201

(22) PCT Filed: Feb. 16, 2017

(86) PCT No.: PCT/CN2017/073724
§ 371 (c)(1),
(2) Date: Mar. 7, 2017

(87) PCT Pub. No.: WO2018/133143
PCT Pub. Date: Jul. 26, 2018

(65) Prior Publication Data
US 2018/0233696 A1    Aug. 16, 2018

(30) Foreign Application Priority Data

Jan. 19, 2017 (CN) .......................... 2017 1 0038977

(51) Int. Cl.
*H01L 51/52* (2006.01)
*H01L 51/56* (2006.01)

(52) U.S. Cl.
CPC ........ *H01L 51/5246* (2013.01); *H01L 51/524* (2013.01); *H01L 51/525* (2013.01); *H01L 51/56* (2013.01)

(58) Field of Classification Search
CPC .......................... H01L 51/524; H01L 51/525
See application file for complete search history.

(56) References Cited

U.S. PATENT DOCUMENTS

| 2015/0261258 A1* | 9/2015 | Kim | ....................... H01L 27/323 345/173 |
| 2017/0098797 A1* | 4/2017 | Eom | ................... H01L 27/3262 |

FOREIGN PATENT DOCUMENTS

| CN | 103531718 A | 1/2014 |
| CN | 104119810 A | 10/2014 |

* cited by examiner

*Primary Examiner* — Changhyun Yi
(74) *Attorney, Agent, or Firm* — Leong C. Lei

(57) ABSTRACT

The present invention provides an OLED encapsulation method, which comprises frit coated on a cover plate to correspond to an outer circumference of an OLED device and a water-contact-to-release-heat layer formed on a backing plate to correspond to the frit. The cover plate and the backing plate are laminated together to make the frit contacting the water-contact-to-release-heat layer. Afterwards, a water-contained gas is introduced to cause reaction of the water-contact-to-release-heat layer to release heat so as to heat and melt the frit for bonding the cover plate and the backing plate, and compared to the prior art, there is no need of a laser based operation so that the cost of laser facility can be saved, the manufacturing cost can be reduced, and also, the heat generated by the water-contact-to-release-heat layer is controllable and uniform, so that the effect of encapsulation is good and product yield is high.

14 Claims, 6 Drawing Sheets

OLED ENCAPSULATION METHOD

BACKGROUND OF THE INVENTION

1. Field of the Invention

The present invention relates to the field of display technology, and more particular to an organic light-emitting diode (OLED) encapsulation method.

2. The Related Arts

Organic light-emitting diode (OLED) displays, which are also referred to as organic electroluminescent displays, are a newly emerging flat panel display device and possess various advantages, such as being self-luminous, low drive voltage, high luminous brightness, short response time, high clarity and contrast, almost 180° view angle, wide range of operation temperature, and easy realization of flexible displaying and large-area full-color displaying, and are considered the most promising display devices.

An OLED device is generally made up of a substrate, an anode arranged on the substrate, a hole injection layer arranged on the anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED device often uses an indium tin oxide (ITO) pixel electrode and a metal electrode to respectively serve as the anode and cathode of the device and electrons and holes, when driven by a predetermined electrical voltage, are respectively injected from the cathode and the anode into the electron transport layer and the hole transport layer such that the electrons and the holes respectively migrate through the electron transport layer and the hole transport layer to get into the emissive layer and meet in the emissive layer to form excitons that excite light emissive molecules to emit light, the later undergoing radiation relaxation to give off visible light.

A known OLED display device generally requires a cover plate provided atop the OLED device to encapsulate the OLED device. To improve air tightness between the cover plate and the backing substrate in order to prevent the invasion of external moisture and oxygen that would causes deterioration of the performance of the OLED device, frit that serves as a bonding agent is applied between the cover plate and backing substrate and laser sealing is then applied to make the frit bond the cover plate and the backing substrate to each other. FIG. 1 is a schematic view illustrating the structure of a conventional OLED device that adopts encapsulation involving a cover plate and frit, generally comprising a backing plate 100', an OLED device 200' arranged on the backing plate 100', a cover plate 300' arranged above the OLED device 200', and frit 400' arranged on an outer circumference of the OLED device 200' and connecting the backing plate 100' and the cover plate 300'. To manufacture the OLED display device, the OLED device 200' is first formed on the backing plate 100' and then a circle of frit 400' is coated on the cover plate 300' at a location corresponding to the outer circumference of the OLED device 200'. Afterwards, high temperature sintering is applied to the frit 400' to remove organic solvent and organic adhesive agent. Then, the side of the cover plate 200' on which the frit 400' is coated is laminated to the side of the backing plate 100' on which the OLED device 200' is formed and the frit 400' is irradiated with laser for melting and bonding to the backing plate 100' and the cover plate 300'. Finally, a cutting operation is carried out to complete the manufacturing of the OLED display device. However, a machine that is used to irradiate frit 400' with laser is of a high cost and this would greatly increase the cost of the OLED display device. Further, the operation of irradiating frit with laser is hard to control, and it is easy to cause failure of encapsulation, affecting the quality of the OLED display device.

SUMMARY OF THE INVENTION

An objective of the present invention is to provide an organic light-emitting diode (OLED) encapsulation method, which is easy to operate, has a low manufacturing cost, provides a good encapsulation effect, and has high product yield.

To achieve the above objective, the present invention provides an OLED encapsulation method, which comprises the following steps:

Step 1: providing a backing plate, forming an OLED device on the backing plate, and forming a water-contact-to-release-heat layer on the backing plate to correspond to an outer circumference of the OLED device;

Step 2: providing a cover plate and coating a circle of frit on the cover plate to correspond to the outer circumference of the OLED device, such that the frit is located to correspond to the water-contact-to-release-heat layer;

Step 3: conducting high temperature sintering on the frit;

Step 4: laminating a side of the cover plate on which the frit is coated and a side of the backing plate on which the OLED device is formed to each other in a vacuum environment so as to make the frit contacting the water-contact-to-release-heat layer; and Step 5: introducing a water-containing gas to cause reaction of the water-contact-to-release-heat layer to release heat for heating and melting the frit for bonding with the backing plate and the cover plate.

The water-contact-to-release-heat layer is in the form of a rectangular frame.

The water-contact-to-release-heat layer has a width that is greater than a width of the frit.

The water-contact-to-release-heat layer is of a material comprising one or multiple ones of sodium and magnesium.

In Step 1, vapor deposition or sputtering is employed to form the water-contact-to-release-heat layer.

In Step 2, screen printing, dispensing, or nozzle printing is employed to coat the frit.

The cover plate is formed of a material comprising glass.

The water-containing gas comprises water vapor or air.

The present invention also provides an OLED encapsulation method, which comprises the following steps:

Step 1: providing a backing plate, forming an OLED device on the backing plate, and forming a water-contact-to-release-heat layer on the backing plate to correspond to an outer circumference of the OLED device;

Step 2: providing a cover plate and coating a circle of frit on the cover plate to correspond to the outer circumference of the OLED device, such that the frit is located to correspond to the water-contact-to-release-heat layer;

Step 3: conducting high temperature sintering on the frit;

Step 4: laminating a side of the cover plate on which the frit is coated and a side of the backing plate on which the OLED device is formed to each other in a vacuum environment so as to make the frit contacting the water-contact-to-release-heat layer; and Step 5: introducing a water-containing gas to cause reaction of the water-contact-to-release-heat layer to release heat for heating and melting the frit for bonding with the backing plate and the cover plate;

wherein the water-contact-to-release-heat layer is in the form of a rectangular frame; and wherein in Step 1, vapor deposition or sputtering is employed to form the water-contact-to-release-heat layer.

The efficacy of the present invention is that the present invention provides an OLED encapsulation method, which comprises frit coated on a cover plate to correspond to an outer circumference of an OLED device and a water-contact-to-release-heat layer formed on a backing plate to correspond to the frit. The cover plate and the backing plate are laminated together to make the frit contacting the water-contact-to-release-heat layer. Afterwards, a water-contained gas is introduced to cause reaction of the water-contact-to-release-heat layer to release heat so as to heat and melt the frit for bonding the cover plate and the backing plate, and compared to the prior art, there is no need of a laser based operation so that the cost of laser facility can be saved, the manufacturing cost can be reduced, and also, the heat generated by the water-contact-to-release-heat layer is controllable and uniform, so that the effect of encapsulation is good and product yield is high.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
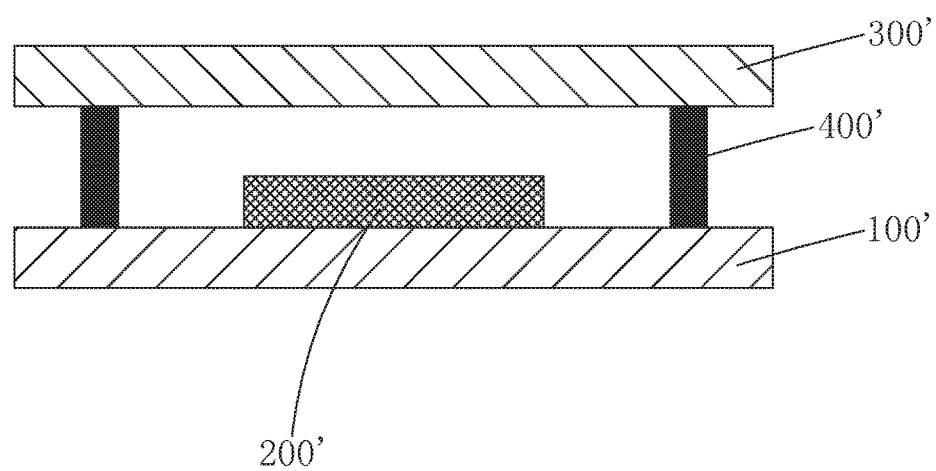
FIG. 1 is a schematic view illustrating the structure of a conventional organic light-emitting diode (OLED) display device adopting encapsulation involving a cover plate and frit.
Figure 2:
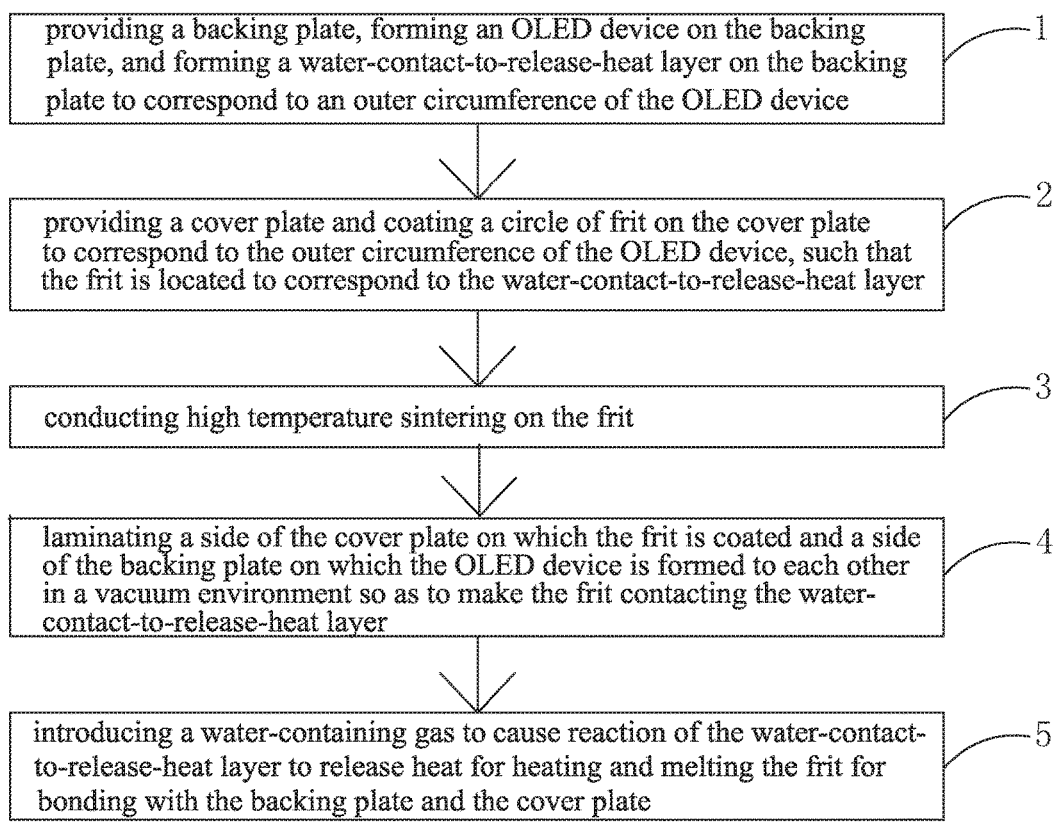
FIG. 2 is a flow chart illustrating an OLED encapsulation method according to the present invention.
Figure 3:
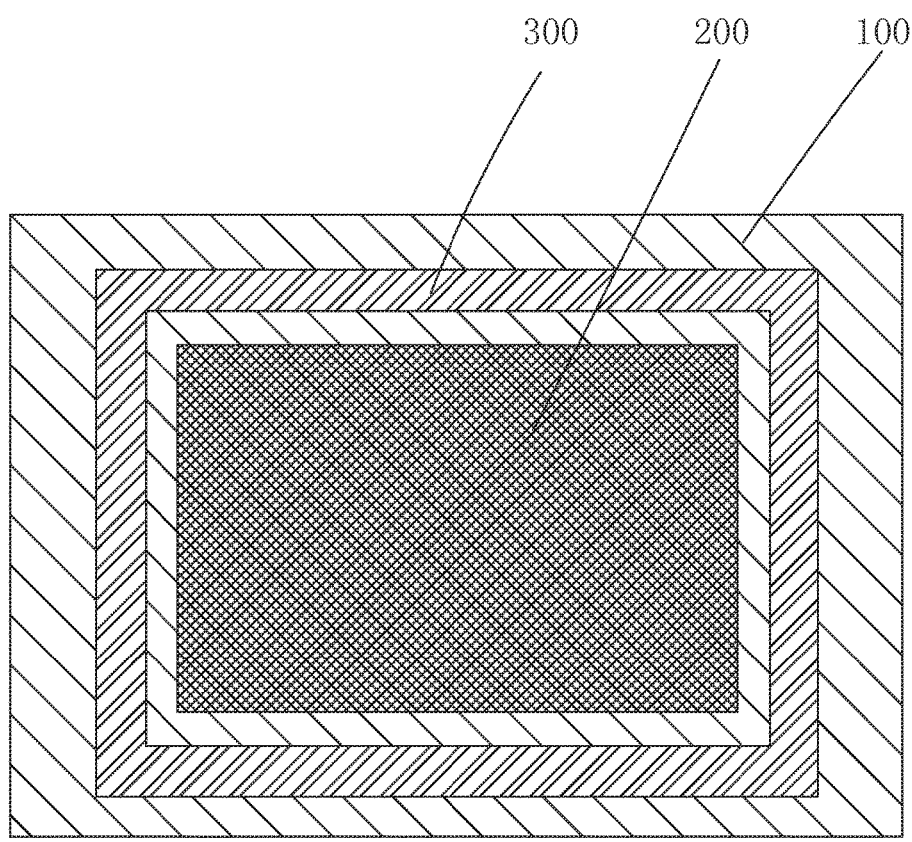
FIG. 3 is a schematic view illustrating Step 1 of the OLED encapsulation method according to the present invention.

Referring to FIG. 2, the present invention provides an organic light-emitting diode (OLED) encapsulation method, which comprises the following steps:

Step 1: referring to FIG. 3, providing a backing plate 100, forming an OLED device 200 on the backing plate 100, and forming a water-contact-to-release-heat layer 300 on the backing plate 100 to correspond to an outer circumference of the OLED device 200.

Specifically, the backing plate 100 is provided thereon with a thin-film transistor (TFT) array layer, and the OLED device 200 is formed on the TFT array layer.

Specifically, the water-contact-to-release-heat layer 300 is provided for releasing heat upon contacting water in a subsequent operation in order to heat and melt frit. Specifically, the water-contact-to-release-heat layer 300 can be of a material that is selected from reactive metals that readily react with water to release a large amount of heat. Preferably, the water-contact-to-release-heat layer 300 is of a material comprising one or multiple ones of sodium (Na) and magnesium (Mg) and may alternatively be other materials that react with water to release heat.

Specifically, in Step 1, vapor deposition or sputtering is used to form the water-contact-to-release-heat layer 300.

Specifically, the water-contact-to-release-heat layer 300 has a thickness that is determined according to practical product requirement provided the amount of heat released therefrom is sufficient to heat frit to a melting temperature thereof.

Figure 4:
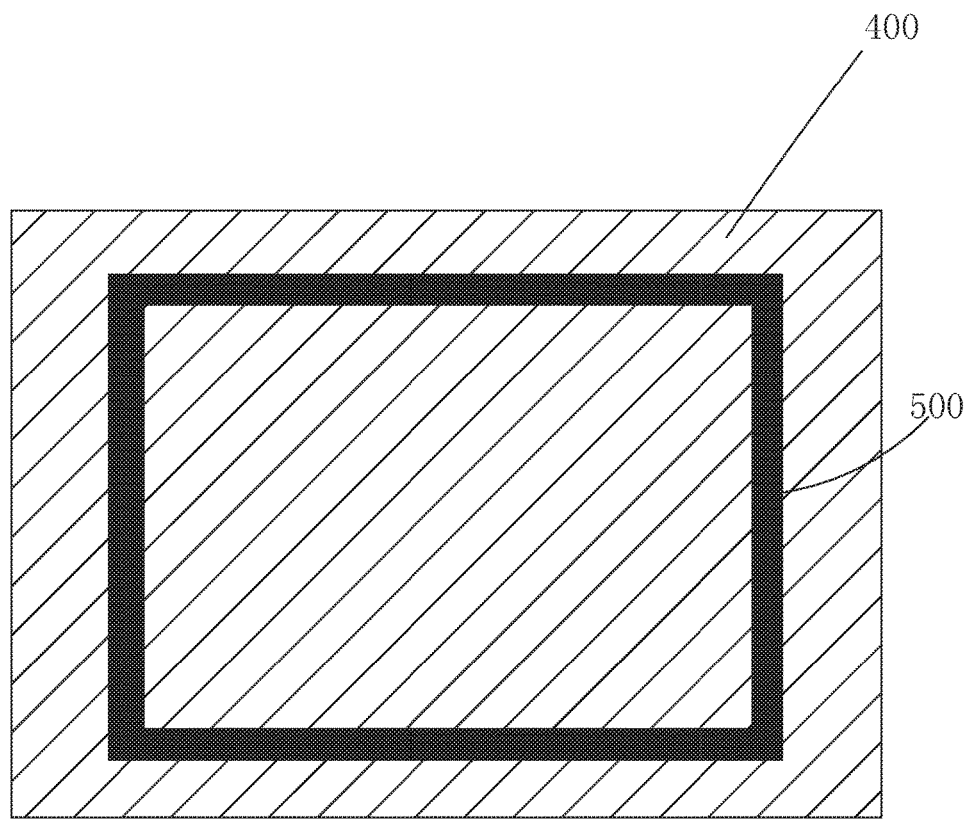
FIG. 4 is a schematic view illustrating Step 2 o of the OLED encapsulation method according to the present invention.

Step 2: referring to FIG. 4, providing a cover plate 400 and coating a circle of frit 500 on the cover plate 400 to correspond to the outer circumference of the OLED device 200 such that the frit 500 is located to correspond to the water-contact-to-release-heat layer 300.

Specifically, the frit 500 is in the form of a rectangular frame and the water-contact-to-release-heat layer 300 has a shape that is a rectangular frame to be in consistency therewith so that the water-contact-to-release-heat layer 300 may completely heat the entirety of the frit 500.

Further, to ensure that the water-contact-to-release-heat layer 300 may effectively heat up the entirety of the frit 500 in a subsequent operation, the water-contact-to-release-heat layer 300 is made with a width that is greater than a width of the frit 500.

Specifically, the cover plate 300 is formed of a material comprising glass.

Specifically, in Step 2, screen printing, dispensing, or nozzle printing is employed to coat the frit 500.

Step 3: conducting high temperature sintering on the frit 500.

Specifically, the high temperature sintering step helps remove solvent and organic adhesive contained in the frit 500.

Figure 5:
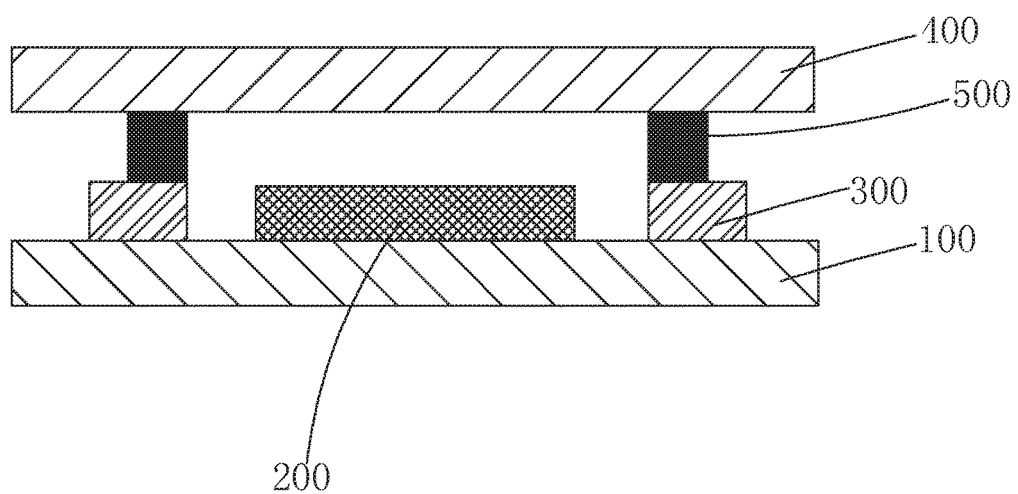
FIG. 5 is a schematic view illustrating Step 4 o of the OLED encapsulation method according to the present invention.

Step 4: referring to FIG. 5, laminating a side of the cover plate 400 on which the frit 500 is coated and a side of the backing plate 100 on which the OLED device 200 is formed to each other in a vacuum environment so as to make the frit 500 contacting the water-contact-to-release-heat layer 300.

Figure 6:
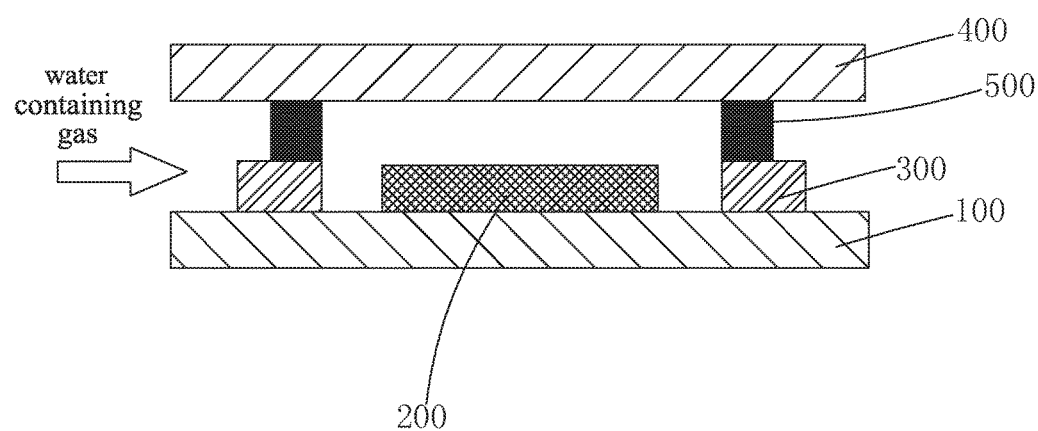
FIG. 6 is a schematic view illustrating Step 5 of the OLED encapsulation method according to the present invention.

Step 5: referring to FIG. 6, introducing a water-containing gas to cause reaction of the water-contact-to-release-heat layer 300 to release heat for heating and melting the frit 500 for bonding with the backing plate 100 and the cover plate 400.

Specifically, the water-containing gas is water vapor or air and is preferably water vapor.

Specifically, Step 4 and Step 5 are both conducted in a vacuum align system (VAS).

Specifically, in case that the material of the water-contact-to-release-heat layer 300 is selected to be one or multiple ones of sodium and magnesium, the water-contact-to-release-heat layer 300 reacts with water to release a great amount of heat and at the same time generate powder-like solid substrate so that the frit 500 in a molten condition bonds the backing plate 100 and the cover plate 400 and at the same time encloses the powder-like solid substance.

The present invention provides an OLED encapsulation method, which comprises a circle of frit 500 coated on the cover plate 400 to correspond to an outer circumference of the OLED device 200 and comprises a water-contact-to-release-heat layer 300 formed on the backing plate 100 to correspond to the frit 500. In a vacuum condition, the side of the cover plate 400 that is provided with the frit 500 and the side of the backing plate 100 that is provided with the OLED device 200 are laminated to each other to make the frit 500 contact the water-contact-to-release-heat layer 300. Then, a water containing gas is introduced in so that water contained in the water containing gas may react with the water-contact-to-release-heat layer 300 to make the water-contact-to-release-heat layer 300 release a large amount of heat to thus heat and melt the frit 500 that is set in contact with the water-contact-to-release-heat layer 300, thereby allowing the frit 500 to bond the backing plate 100 and the cover plate 400 to complete encapsulation of the OLED. Since the water-contact-to-release-heat layer 300 can be designed in respect of thickness thereof and the amount of water contained gas that is introduced in can be controlled such that an amount of heat that may make the frit 500 reach a melting temperature can be generated, and thus, there is no need for a laser based operation. The cost of laser facility can be saved and the manufacturing cost can be reduced. Further, the amount of heat generated by the water-contact-to-release-heat layer 300 can be controlled and the heat is uniformly distributed on the water-contact-to-release-heat layer 300, so that there is no need to conduct testing of a laser operation and the operation is made easy, thereby improving the effect of melting of the frit 500, ensuring encapsulation result of the OLED, and effectively improving product yield.

In summary, the present invention provides an OLED encapsulation method, which comprises frit coated on a cover plate to correspond to an outer circumference of an OLED device and a water-contact-to-release-heat layer formed on a backing plate to correspond to the frit. The cover plate and the backing plate are laminated together to make the frit contacting the water-contact-to-release-heat layer. Afterwards, a water-contained gas is introduced to cause reaction of the water-contact-to-release-heat layer to release heat so as to heat and melt the frit for bonding the cover plate and the backing plate, and compared to the prior art, there is no need of a laser based operation so that the cost of laser facility can be saved, the manufacturing cost can be reduced, and also, the heat generated by the water-contact-to-release-heat layer is controllable and uniform, so that the effect of encapsulation is good and product yield is high.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An organic light-emitting diode (OLED) encapsulation method, comprising the following steps:
    Step 1: providing a backing plate, forming an OLED device on the backing plate, and forming a water-contact-to-release-heat layer on the backing plate to correspond to an outer circumference of the OLED device;
    Step 2: providing a cover plate and coating a circle of frit on the cover plate to correspond to the outer circumference of the OLED device, such that the frit is located to correspond to the water-contact-to-release-heat layer;
    Step 3: conducting high temperature sintering on the frit;
    Step 4: laminating a side of the cover plate on which the frit is coated and a side of the backing plate on which the OLED device is formed to each other in a vacuum environment so as to make the frit contacting the water-contact-to-release-heat layer; and
    Step 5: introducing a water-containing gas to cause reaction of the water-contact-to-release-heat layer to release heat for heating and melting the frit for bonding with the backing plate and the cover plate;
    wherein the water-contact-to-release-heat layer undergoes a chemical reaction with water contained in the water-containing gas so introduced to release heat so as to be converted from a first form into a second form that is different from the first form.

2. The OLED encapsulation method as claimed in claim 1, wherein the water-contact-to-release-heat layer is in the form of a rectangular frame.

3. The OLED encapsulation method as claimed in claim 2, wherein the water-contact-to-release-heat layer has a width that is greater than a width of the frit.

4. The OLED encapsulation method as claimed in claim 1, wherein the water-contact-to-release-heat layer is of a material comprising one or multiple ones of sodium and magnesium.

5. The OLED encapsulation method as claimed in claim 1, wherein in Step 1, vapor deposition or sputtering is employed to form the water-contact-to-release-heat layer.

6. The OLED encapsulation method as claimed in claim 1, wherein in Step 2, screen printing, dispensing, or nozzle printing is employed to coat the frit.

7. The OLED encapsulation method as claimed in claim 1, wherein the cover plate is formed of a material comprising glass.

8. The OLED encapsulation method as claimed in claim 1, wherein the water-containing gas comprises water vapor or air.

9. An organic light-emitting diode (OLED) encapsulation method, comprising the following steps:
    Step 1: providing a backing plate, forming an OLED device on the backing plate, and forming a water-contact-to-release-heat layer on the backing plate to correspond to an outer circumference of the OLED device;
    Step 2: providing a cover plate and coating a circle of frit on the cover plate to correspond to the outer circumference of the OLED device, such that the frit is located to correspond to the water-contact-to-release-heat layer;
    Step 3: conducting high temperature sintering on the frit;
    Step 4: laminating a side of the cover plate on which the frit is coated and a side of the backing plate on which the OLED device is formed to each other in a vacuum environment so as to make the frit contacting the water-contact-to-release-heat layer; and
    Step 5: introducing a water-containing gas to cause reaction of the water-contact-to-release-heat layer to release heat for heating and melting the frit for bonding with the backing plate and the cover plate;
    wherein the water-contact-to-release-heat layer undergoes a chemical reaction with water to release heat so as to be converted from a first form into a second form that is different from the first form;

wherein the water-contact-to-release-heat layer is in the form of a rectangular frame; and wherein in Step 1, vapor deposition or sputtering is employed to form the water-contact-to-release-heat layer.

10. The OLED encapsulation method as claimed in claim 9, wherein the water-contact-to-release-heat layer has a width that is greater than a width of the frit.

11. The OLED encapsulation method as claimed in claim 9, wherein the water-contact-to-release-heat layer is of a material comprising one or multiple ones of sodium and magnesium.

12. The OLED encapsulation method as claimed in claim 9, wherein in Step 2, screen printing, dispensing, or nozzle printing is employed to coat the frit.

13. The OLED encapsulation method as claimed in claim 9, wherein the cover plate is formed of a material comprising glass.

14. The OLED encapsulation method as claimed in claim 9, wherein the water-containing gas comprises water vapor or air.

* * * * *